United States Patent
Cha et al.

(10) Patent No.: US 7,725,088 B2
(45) Date of Patent: May 25, 2010

(54) FAST MODE SWITCHING FREQUENCY SYNTHESIZING APPARATUS AND METHOD FOR OPERATING IN LOW POWER CONSUMPTION

(75) Inventors: Choong-Yul Cha, Yongin-si (KR); Hoon Tae Kim, Yongin-si (KR); Chun Deok Suh, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1001 days.

(21) Appl. No.: 11/475,973

(22) Filed: Jun. 28, 2006

(65) Prior Publication Data

US 2007/0104290 A1 May 10, 2007

(30) Foreign Application Priority Data

Nov. 10, 2005 (KR) .................. 10-2005-0107297

(51) Int. Cl.
*H04B 1/18* (2006.01)
(52) U.S. Cl. .............. 455/183.1; 455/118; 455/313; 455/296; 455/115.1; 455/323; 375/296; 375/297; 375/350; 375/302
(58) Field of Classification Search ............ 455/118, 455/313, 296, 115.1, 323, 183.1; 375/296, 375/297, 350, 302
See application file for complete search history.

(56) References Cited

U.S. PATENT DOCUMENTS

| 4,931,746 | A | 6/1990 | Trankle et al. |
| 5,933,771 | A | 8/1999 | Tiller et al. |
| 6,496,545 | B1 | 12/2002 | Liu |
| 6,850,742 | B2* | 2/2005 | Fayyaz ............. 455/118 |
| 7,103,327 | B2* | 9/2006 | Pan ............... 455/102 |
| 7,457,605 | B2* | 11/2008 | Thompson et al. ....... 455/313 |
| 7,580,478 | B2* | 8/2009 | Seo et al. ............ 375/307 |
| 2007/0077908 | A1* | 4/2007 | Vorenkamp et al. ...... 455/323 |

FOREIGN PATENT DOCUMENTS

| JP | 04-240904 A | 8/1992 |
| JP | 08-288749 A | 11/1996 |
| JP | 2000-165149 A | 6/2000 |
| JP | 2002-223126 A | 8/2002 |
| JP | 2004-297183 A | 10/2004 |
| KR | 10-1999-0037432 A | 5/1999 |
| KR | 10-2003-0013193 A | 2/2003 |

* cited by examiner

*Primary Examiner*—Sanh D Phu
(74) *Attorney, Agent, or Firm*—Sughrue Mion, PLLC

(57) ABSTRACT

A fast mode switching frequency synthesizing apparatus and method for operating in low power consumption. In the frequency synthesizer, according to a mode control signal, an SSB mixer selectively generates and outputs a signal having a frequency which is identical to an input signal RF or outputs a signal having a frequency which is a synthesized frequency of the input signals RF and LO. Frequency synthesized signals having a frequency which is a sum of frequencies of the input signals RF and LO, or a difference of frequencies therebetween, may be generated by changing wiring of a path switch according to a phase control signal.

20 Claims, 7 Drawing Sheets

FAST MODE SWITCHING FREQUENCY SYNTHESIZING APPARATUS AND METHOD FOR OPERATING IN LOW POWER CONSUMPTION

CROSS-REFERENCE TO RELATED APPLICATION

This application claims priority from Korean Patent Application No. 10-2005-107297, filed on Nov. 10, 2005, in the Korean Intellectual Property Office, the entire disclosure of which is incorporated herein by reference.

BACKGROUND OF THE INVENTION

1. Field of the Invention

Apparatuses and methods consistent with the present invention relate to a frequency synthesizer or a mixer of high frequency signals, and more particularly, to frequency synthesizing capable of providing a fast operation with a low power consumption by not using a frequency selection switch, but by using mode switching.

2. Description of Related Art

A high speed wireless data transceiving system such as a cellular phone, a digital multimedia broadcasting (DMB) phone, a personal digital assistant (PDA), etc., needs a frequency synthesizer to process multi-tone signals for a frequency down conversion in a transceiver.

FIG. 1 illustrates an example of a conventional frequency synthesizer 100. Referring to FIG. 1, the frequency synthesizer 100 includes a first single side band (SSB) mixer 110, a second SSB mixer 130, and a switch 120 for selecting a frequency. The second SSB mixer 130 generates three frequency signals, such as F13M, F13D and F123, from a first high frequency signal F1 and an output of the switch 120. The first SSB mixer 110 generates a signal F23 from a second high frequency signal F2 and a third high frequency signal F3. In this case, a frequency of the signal F23 is an addition of frequencies of the signals F2 and F3. When the signal F23 is selected by the switch 120, the second SSB mixer 130 generates the signal F123 from the signals F1 and F23, the signal F123 of which a frequency is a difference of frequencies between the signals F1 and F23. Also, when the signal F3 is selected by the switch 120, the second SSB mixer 130 generates the signal F13D from the signals F1 and F3, the signal F13D has a frequency which is a difference of frequencies between the signals F1 and F3. By changing internal wiring of the second SSB mixer 130, the second SSB mixer 130 may generate the signal F13M from the signals F1 and F3, the signal F13M has a frequency which is a sum of frequencies of the signals F1 and F3.

FIG. 2 illustrates another example of a conventional frequency synthesizer 200. Referring to FIG. 2, the frequency synthesizer 200 includes an SSB mixer 210 and a switch 220 for selecting a frequency. The SSB mixer 210 generates a signal F12M from a first high frequency signal F1 and a second high frequency F2, the signal F12M of which a frequency is a sum of frequencies of the signals F1 and F2. By changing internal wiring of the second SSM mixer 210, the SSB mixer 210 may generate a signal F12D from the signals F1 and F2, the signal F12D has a frequency which is a difference of frequencies between the signals F1 and F2. Namely, according to a selection of the switch 220, any one of the signals F12M and F2 may be output. Also, any one of the signals F12D and F2 may be outputted.

As described above, the conventional frequency synthesizer has to generate three multi-frequency signals, for example, 4488, 3960 and 3432 MHz signals, in a transceiver of a system transceiving high speed wireless data. Also, the conventional frequency synthesizer has to use a frequency selection switch to selectively output any one of the generated signals. More mixers may be utilized to output more than three high multi-frequency signals without a frequency selection switch. However, in this case, circuits get more complicated and more power is consumed. Also, when utilizing a frequency selection switch, a large buffer is needed to actuate the switch. Accordingly, power consumption increases. As an example, to implement fast frequency switching of less than 9.5 nsec, and also to output high frequency signals via the switches 120 and 220 illustrated in FIGS. 1 and 2, a larger buffer is needed to be provided in a front portion of the switches 120 and 220.

BRIEF SUMMARY OF THE INVENTION

To address the aforementioned problems in the conventional art, the exemplary embodiments of the present invention provides a frequency synthesizer which can selectively generate and output high multi-frequency signals according to a mode switching control of an internal circuit of a mixer, for a fast operation with low power consumption.

The present invention also provides a frequency synthesizing method which can operate fast and with a low power consumption by not using a frequency selection switch, but by using mode switching.

To achieve the above objectives, according to an exemplary embodiment of the present invention, there is provided a frequency synthesizer including: a first double side band (DSB) mixer which receives a first input signal and a second input signal; and a second DSB mixer which receives a Q signal of the first input signal and a Q signal of the second input signal, wherein the frequency synthesizer selectively generates and outputs a signal having a frequency which is identical to the first input signal, or generates and outputs a frequency synthesized signal of the first input signal and the second input signal, from a terminal connecting an output of the first DSB mixer and an output of the second DSB mixer, according to a mode control signal.

According to an exemplary embodiment of the present invention, there is provided a frequency synthesizer including: a first single side band (SSB) mixer which receives a first input set comprising a first input signal and a Q signal thereof, and a second input set comprising a second input signal and a Q signal thereof; and a second SSB mixer which receives the first input set and the second input set, wherein: the first SSB mixer selectively generates a first output signal with a phase and frequency which is identical to the first input signal, or generates a second output signal with a frequency which is a synthesized frequency of the first input signal and the second input signal, according to a mode control signal, and the second SSB mixer selectively generates the Q signal of the first output signal or the Q signal of the second output signal according to the mode control signal.

According to an exemplary embodiment of the present invention, there is provided a DSB mixer including: an amplifier which receives a first input set comprising differential signals and a second input set comprising other differential signals; and a resistor connected between a signal terminal of any one of the second input set and a terminal which supplies a synthesis and amplification control signal, wherein the amplifier selectively generates a first output set with a phase and frequency which is identical to the first input set or a second output set with a frequency which is a synthesized frequency of the first input set and the second input set, according to a synthesis and amplification control signal.

According to an exemplary embodiment of the present invention, there is provided a DSB mixer including: an amplifier which receives a first input set comprising differential signals and a second input set comprising other differential signals; and resistors connected between each of signal terminals of the second input set and a terminal which supplies a synthesis control signal, wherein, the amplifier receives an amplification control signal via a gate of a transistor connected in parallel with a transistor which receives any one of the differential signals of the second input set, and the amplifier selectively generates a first output set with a phase and frequency which is identical to the first input set or generates a second output set with a frequency, which is a synthesized frequency of the first input set and the second input set, if any one of the amplification control signal and the synthesis control signal are activated.

According to an exemplary embodiment of the present invention, there is provided a method for synthesizing frequencies using a first DSB mixer and a second DSB mixer, the method including receiving a first input signal and a second input signal in the first DSB mixer; receiving a Q signal of the first input signal and a Q signal of the second input signal in the second DSB mixer; generating a frequency synthesized signal of the first input signal and the second input signal from a terminal connecting an output of the first DSB mixer and an output of the second DSB mixer, if a mode control signal controlling the type of an output is activated; and generating a signal of with a frequency which is identical to the first input signal, from a terminal connecting the output of the first DSB mixer and the output of the second DSB mixer, if the mode control signal is inactivated.

According to an exemplary embodiment of the present invention, there is provided a method for synthesizing frequencies using a first SSB mixer and a second SSB mixer, the method comprising receiving a first input set comprising a first input signal and a Q signal thereof and a second input set comprising a second input signal and a Q signal thereof, in the first SSB mixer and the second SSB mixer; and generating a first output with a frequency which is a synthesized frequency of the first input signal and the second input signal, from the first SSB mixer, and generating a Q signal of the first output from the second SSB mixer, if a mode control signal is activated to control the type of an output; and generating a second output with a phase and frequency which is identical to the first input signal, from the first SSB mixer, and a Q signal of the second output from the second SSB mixer, if the mode control signal is inactivated.

BRIEF DESCRIPTION OF THE DRAWINGS

The above and/or other aspects of the present invention will become apparent and more readily appreciated from the following detailed description, taken in conjunction with the accompanying drawings, of which.

DETAILED DESCRIPTION OF EXEMPLARY EMBODIMENTS

Figure 1:
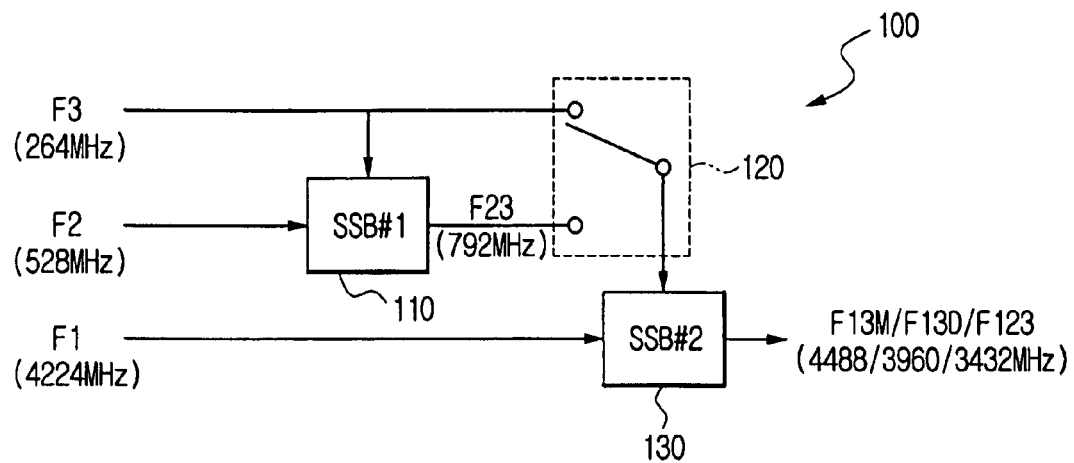
FIG. 1 is a diagram illustrating an example of a conventional frequency synthesizer.
Figure 2:
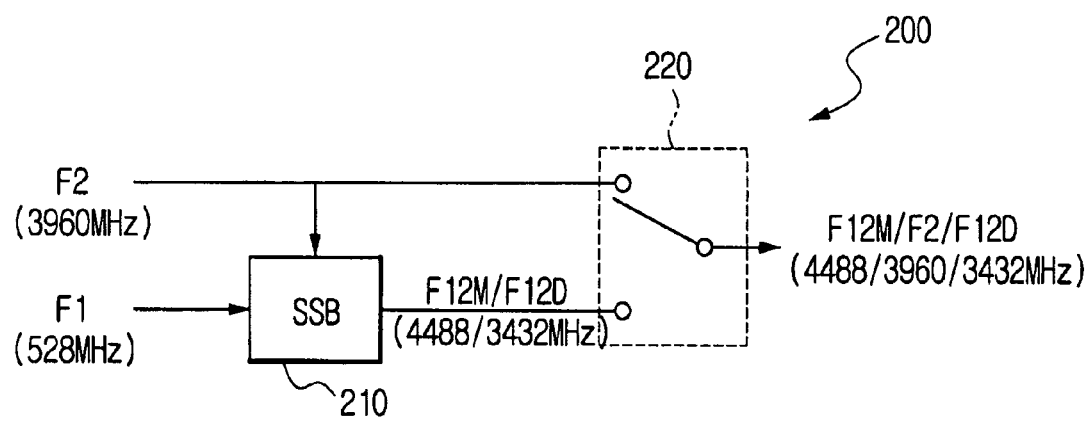
FIG. 2 is a diagram illustrating another example of a conventional frequency synthesizer.

Reference will now be made in detail to exemplary embodiments of the present invention, examples of which are illustrated in the accompanying drawings, wherein like reference numerals refer to the like elements throughout. The embodiments are described below in order to explain the present invention by referring to the figures.

Figure 3:
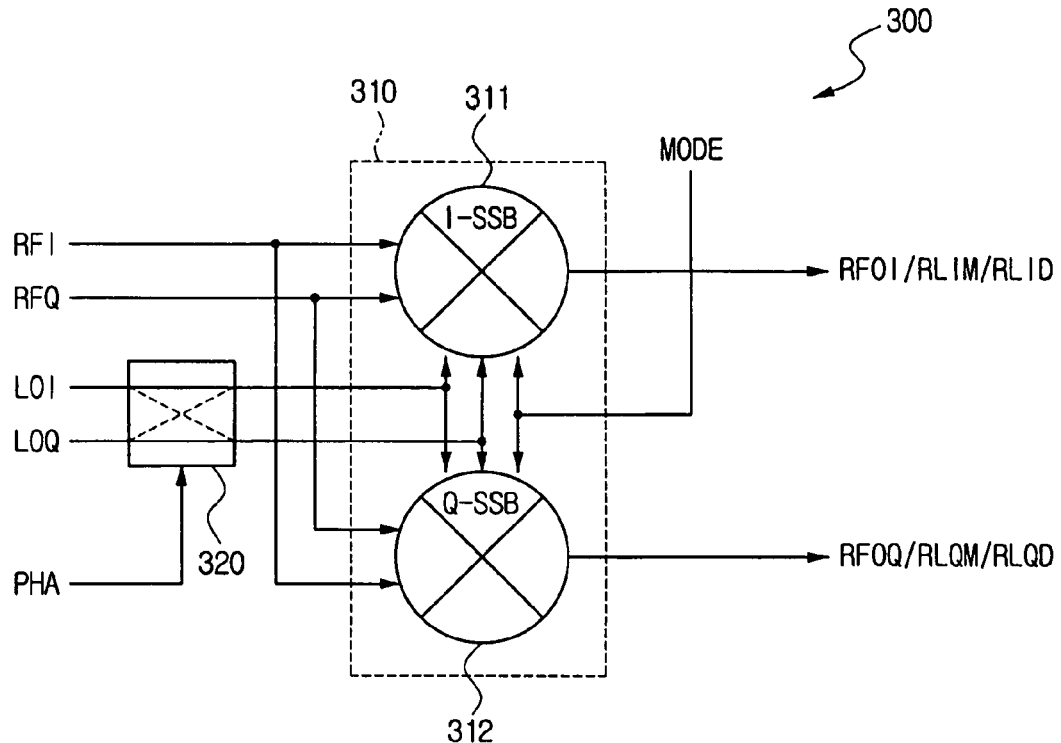
FIG. 3 is a diagram illustrating a frequency synthesizer according to an exemplary embodiment of the present invention.

FIG. 3 is a diagram illustrating a frequency synthesizer 300 according to an exemplary embodiment of the present invention. Referring to FIG. 3, the frequency synthesizer 300 includes a quadrature mixer 310 and a path switch 320. Also, the quadrature mixer 310 includes an I-single side band (SSB) mixer 311 and a Q-SSB mixer 312.

The SSB mixer generates and outputs an SSB signal with a frequency which is a sum of frequencies of two inputted high frequency signals or a difference of frequencies therebetween. The frequency synthesizer 300 utilizes two SSB mixers 311 and 312, to generate two SSB signals having a 90 degree phase difference with respect to each other. The frequency of each SSB signal output from the SSB mixers 311 and 312 may be controlled according to a mode control signal MODE. Namely, mode switching of an internal circuit of the SSB mixers 311 and 312 is controlled according to the mode control signal MODE. Accordingly, in comparison with the conventional method of initially generating output signals and subsequently determining a final output via a switch, a stable and fast operation, with low power consumption, is provided without being burdened with a large load in a signal transmission path.

In FIG. 3, the I-SSB mixer 311 receives a first input set and a second input set. In an exemplary embodiment, the first input set includes a first high frequency signal RFI and a Q signal of the first high frequency signal RFI, RFQ. Also, the second input set includes a second high frequency signal LOI and a Q signal of the second high frequency signal LOI, LOQ. The first high frequency signal RFI may be a signal in the form of a radio frequency (RF) signal received in a wireless data transceiver. The second high frequency signal LOI may be a local high frequency signal generated in a phase locked loop (PLL) of the wireless data transceiver.

The Q-SSB mixer 312 receives the first input set RFI and RFQ, and the second input set LOI and LOQ, which is the same as the I-SSB mixer 311. However, wiring of the Q-SSB mixer 312 for receiving the second input set LOI and LOQ is provided to be opposite to the I-SSB mixer 311. Accordingly, gates of transistors which receive the second input set LOI and LOQ receive signals having a 90 degree phase difference from each other. Accordingly, the Q-SSB mixer 312 generates an SSB signal, e.g., RFOQ, which has a 90 degree phase difference with respect to an SSB signal output from the I-SSB mixer 311, e.g., RFOI.

According to the mode control signal MODE, the I-SSB mixer 311 may selectively generate an output RFOI having a phase and frequency which is identical to the first high frequency signal RFI, or generate an output, RLIM, having a frequency which is a sum of frequencies of the first high frequency signal RFI and the second high frequency signal LOI, or generate an output, RLID, having a frequency which is a difference of frequencies of the first high frequency signal RFI and the second high frequency signal LOI. The Q-SSB mixer 312 may generate a Q signal of the output of the I-SSB mixer 311. Namely, the Q-SSB mixer 312 may selectively generate a Q signal RFOQ, of the output RFOI, or generate a Q signal RLQM or RLQD, of the output RLIM or RLID, according to the mode control signal MODE.

As an example, when the mode control signal MODE is activated, i.e., in the case of a logical high, the I-SSB mixer 311 may generate the frequency synthesized signal RLIM or RLID. Also, the Q-SSB mixer 312 may generate the Q signal, RLQM or RLQD, of the frequency synthesized signal RLIM or RLID. Also, when the mode control signal MODE is inactivated, i.e., in the case of a logical low, the I-SSB mixer 311 may generate the output RFOI. Also, the Q-SSB mixer 312 may generate the Q signal, RFOQ, of the output RFOI.

In FIG. 3, both the first high frequency signal RFI and the Q signal thereof RFQ, and the second high frequency signal LOI and the Q signal thereof LOQ, may be formed of differential signals. As an example, the first high frequency RFI may be a set of differential signals, RFI+ and RFI−, having a 180 degree phase difference with respect to each other. In the same manner, a set of differential signals of the RFQ, RFQ+ and RFQ−, a set of differential signals of the LOI, LOI+ and LOI−, and a set of differential signals of the LOQ, LOQ+ and LOQ−, may be prepared.

According to a phase control signal PHA, the path switch 320 is controlled to switch each transmission path of the set of differential signals of the LOI, LOI+ and LOI−, and the set of differential signals of LOQ, LOQ+ and LOQ−. Accordingly, a frequency of a frequency synthesized signal output from the I-SSB mixer 311 and the Q-SSB mixer 312 is different. As an example, if the phase control signal is activated PHA, the I-SSB mixer 311 may receive the set of differential signals of the LOI, LOI+ and LOI−, from two terminals via the path switch 320, and may receive the set of differential signals of the LOQ, LOQ+ and LOQ−, from another two terminals via the path switch 320. In this case, the I-SSB mixer 311 may generate the frequency synthesized signal RLIM having a frequency which is a sum of frequencies of the first high frequency signal RFI and the second high frequency signal LOI. In the same manner, if the phase control signal PHA is activated, the Q-SSB mixer 312 may generate the Q signal, RLQM, of the RLIM.

Also, a path of the set of differential signals of any one of the LOI and the LOQ, which are output from the path switch 320 to the I-SSB mixer 311, may be switched when the phase control signal PHA is inactivated. As an example, LOI+ may be switched to LOI− or LOQ+ to LOQ−. Accordingly, the I-SSB mixer 311 may generate the frequency synthesized signal RLID having a frequency which is a difference of frequencies of the first high frequency signal RFI and the second high frequency signal LOI. In the same manner, if the phase control signal PHA is inactivated, the Q-SSB mixer 312 may generate the Q signal, RLQD, of the RLID. In this case, switching of a path occurs when an input terminal of LOI+ receives LOI−, and an input terminal of LOI− receives LOI+. LOQ+ and LOQ− have no switching of a path. Stated another way, LOI+ and LOI− are received without switching of a path, and when a path is switched to make an input terminal of LOQ+ receive LOQ− and an input terminal of LOQ− receive LOQ+, the same results may be obtained.

Figure 4:
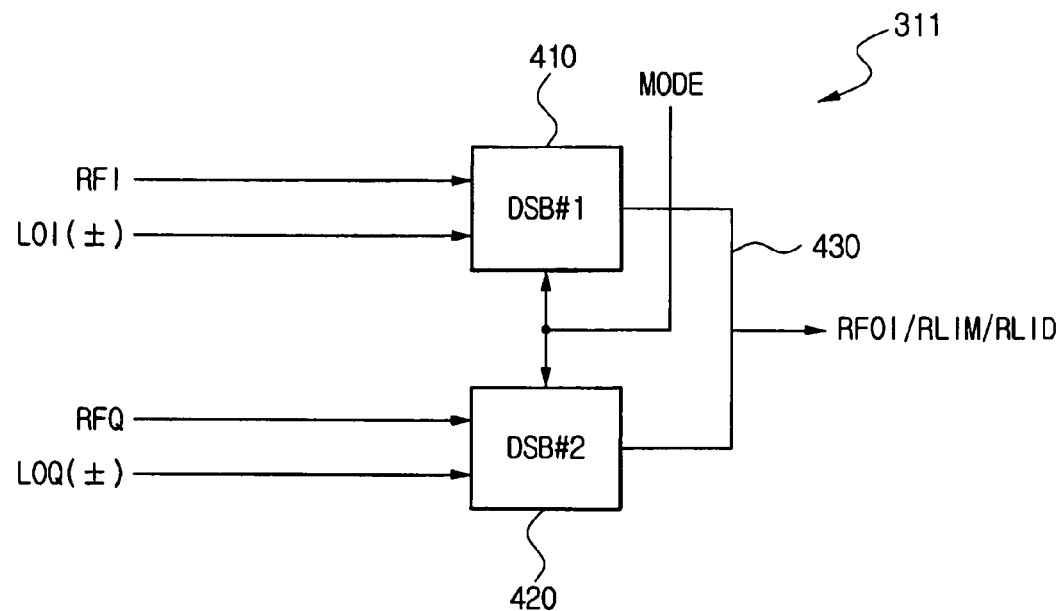
FIG. 4 is a diagram explicitly illustrating an I-SSB mixer of FIG. 3.
Figure 5:
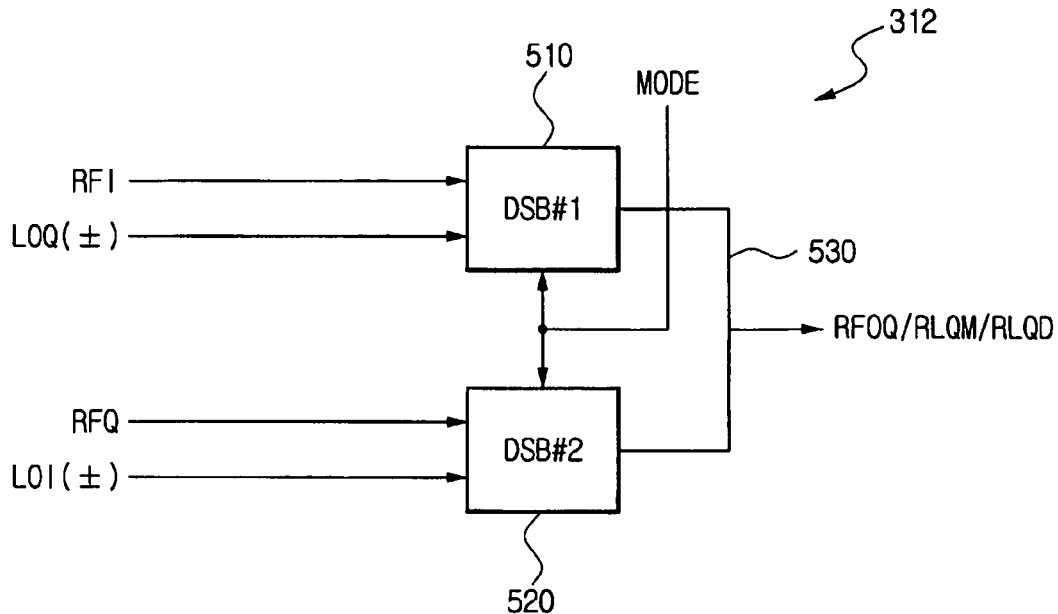
FIG. 5 is a diagram explicitly illustrating a Q-SSB mixer of FIG. 3.

An explicit diagram of the I-SSB mixer 311 in FIG. 3 is illustrated in FIG. 4. An explicit diagram of the Q-SSB mixer 312 in FIG. 3 is illustrated in FIG. 5. As illustrated in FIGS. 4 and 5, each of the SSB mixers 311 and 312 includes two corresponding DSB mixers 410 and 420, or 510 and 520.

In the I-SSB mixer 311, the first DSB mixer 410 receives a first high frequency signal RFI and a second high frequency signal LOI. The second DSB mixer 420 receives a Q signal, RFQ, of the first high frequency signal RFI, and a Q signal, LOQ, of the second high frequency signal LOI. Thus, according to a mode control signal MODE, the first I-SSB mixer 311 selectively generates and outputs a signal RFOI with a frequency that is identical to the first high frequency signal RFI, or generates and outputs a frequency synthesized signal RLIM or RLID of the first high frequency signal RFI and the second high frequency signal LOI, from a terminal 430 connected to an output of the first DSB mixer 410 and an output of the second DSB mixer 420.

As an example, when the mode control signal MODE is activated, the I-SSB mixer 311 operates in a mode to synthesize frequencies of the first high frequency signal RFI and the second high frequency signal LOI. Also, the output of the first DSB mixer 410 and the output of the second DSB mixer 420 are synthesized in the terminal 430 to generate the frequency synthesized signal RLIM or RLID. A phase of the frequency synthesized signal RLIM or RLID may be identical to the first high frequency signal RFI.

Also, if the mode control signal MODE is inactivated, the I-SSB mixer 311 operates in a mode to amplify the first high frequency signal RFI. Also, an amplification output of the first DSB mixer 410 and an amplification output of the second DSB mixer 420 are added in the terminal 430 so as to generate and output the signal RFOI having a frequency which is identical to the first high frequency signal RFI. A phase of the RFOI may be identical to the first high frequency signal RFI.

As illustrated in FIG. 3, the input signals RFI, RFQ, LOI, and LOQ of the I-SSB mixer 311 may be a set of differential signals. According to a path selection of the path switch 320 with respect to the input signals RFI, RFQ, LOI, and LOQ, the I-SSB mixer 311 may generate the frequency synthesized signal RLIM having a frequency which is a sum of frequencies of the first high frequency RFI and the second high frequency LOI, or the frequency synthesized signal RLID having a frequency which is a difference of frequencies therebetween.

Also, in the Q-SSB mixer 312 of FIG. 5, the first DSB mixer 510 receives a first high frequency signal RFI and a second high frequency signal LOQ. The second DSB mixer 520 receives a Q signal, RFQ, of the first high frequency signal RFI, and a Q signal, LOI, of the second high frequency signal LOQ. According to a mode control signal MODE, the Q-SSB mixer 312 selectively generates and outputs a signal RFOQ having a frequency which is identical to the first high frequency signal RFI, or generates and outputs a frequency synthesized signal RLQM or RLQD of the first high frequency signal RFI and the second high frequency signal LOQ, from a terminal 530 connecting an output of the first DSB mixer 510 and an output of the second DSB mixer 520.

As an example, when the mode control signal MODE is activated, the Q-SSB mixer 312 operates in a mode to synthesize frequencies of the first high frequency signal RFI and the second high frequency signal LOQ. The output of the first DSB mixer 510 and the output of the second DSB mixer 520 are synthesized in the terminal 530, so as to generate the frequency synthesized signal RLQM or RLQD. A phase of the frequency synthesized signal RLQM or RLQD may be identical to the RFQ signal.

Also, when the mode control signal MODE is activated, the Q-SSB mixer 312 operates in a mode to amplify the Q signal, RFQ, of the first high frequency signal RFI. An amplification output of the first DSB mixer 510 and an amplification output of the second DSB mixer 520 are added in the terminal 530, so as to generate and output the signal RFOQ which has a frequency identical to the RFA signal. In this case, a phase of the RFOQ signal may be identical to the RFQ signal.

As described in FIG. 3, the input signals RFI, RFQ, LOI, and LOQ of the Q-SSB mixer 312 may be a set of differential signals. According to a path selection of the path switch 320 with respect to the input signals RFI, RFQ, LOI, and LOQ, the Q-SSB mixer 312 may generate the frequency synthesized signal RLQM having a frequency which is a sum of frequencies of the first high frequency signal RFI and the second high frequency signal LOQ or the frequency synthesized signal RLQD having a frequency which is a difference of frequencies therebetween.

Figure 6:
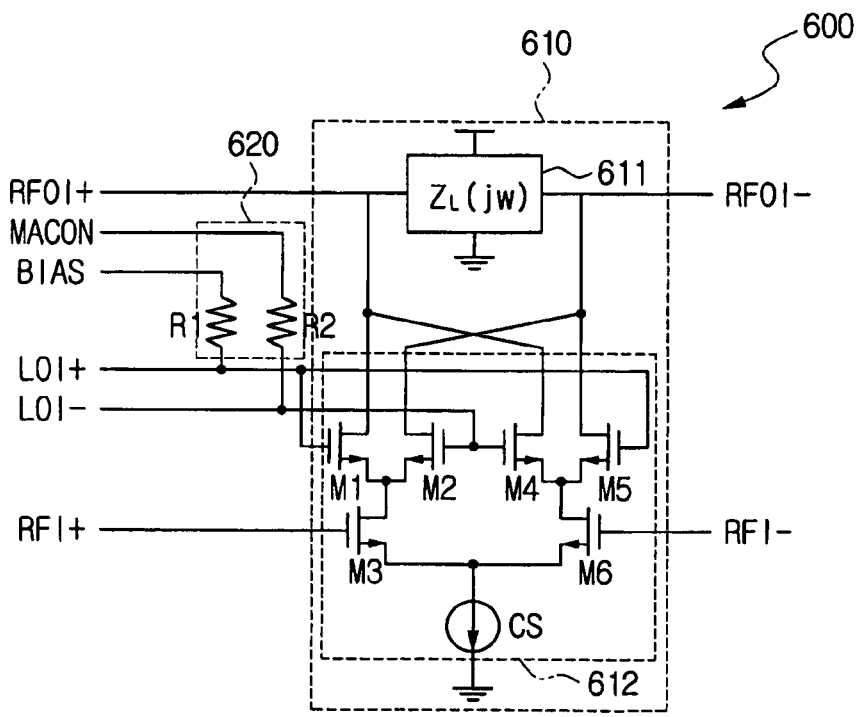
FIG. 6 is an explicit circuit diagram of a DSB mixer according to an exemplary embodiment of the present invention.

FIG. 6 is an explicit circuit diagram of a DSB mixer 600 according to an exemplary embodiment of the present invention. Referring to FIG. 6, the DSB mixer 600 includes an amplifier 610 and a mode controller 620.

The amplifier 610 is in the form of a differential amplifier. Also, the amplifier 610 includes a load LC circuit 611 and a differential input circuit 612. The load LC circuit 611 may include an inductor and a capacitor. Also, the differential input circuit 612 may include a current source CS. The load LC circuit 611 is designed to have a certain impedance $Z_L$. In the differential input circuit 612, an N-type MOSFET (Metal-Oxide-Semiconductor Field Effect Transistor) M3 and N-type MOSFET M6 for receiving first input set RFI+ and RFI−, comprising differential signals, are provided to be symmetrical to each other. Also, an N-type MOSFET M1 and M2, and an N-type MOSFET M4 and M5 for receiving second input set LOI+ and LOI−, comprising other differential signal, and are provided to be symmetrical to each other.

The mode controller 620 has two resistors R1 and R2. The resistor R2 is connected between the LOI− signal terminal and a terminal supplying a synthesis and amplification control signal MACON. The resistor R1 is connected to a certain bias voltage BIAS.

According to the synthesis and amplification control signal MACON, the amplifier 610 may selectively generate an output set, RFOI+ and RFOI−, having a phase and frequency which is identical to the first input set RFI+ and RFI−, or generate an output set, RFOI+ and RFOI−, having a frequency which is a synthesized frequency of the first input set RFI+ and RFI−, and the second input set LOI+ and LOI−.

Figure 7:
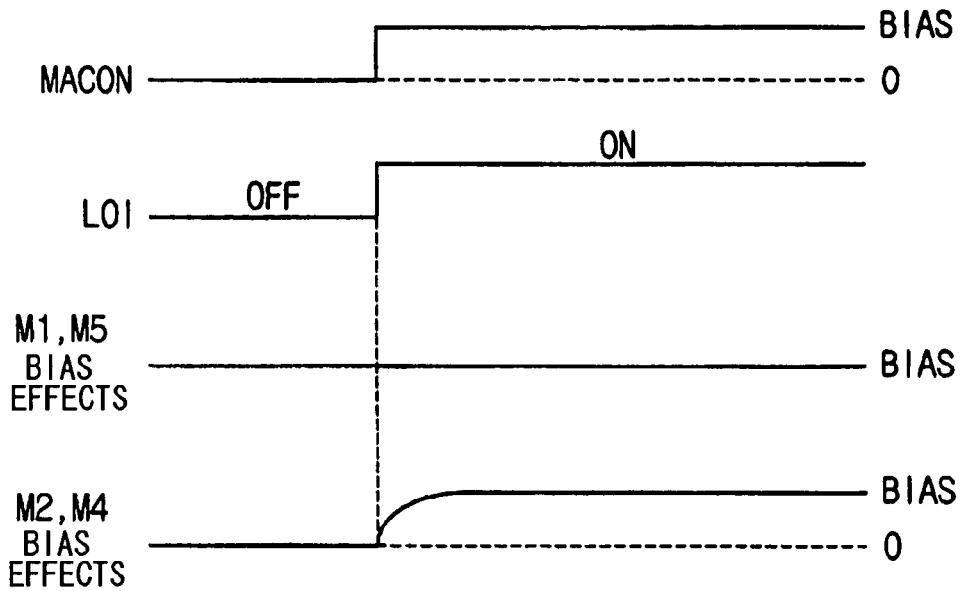
FIG. 7 is a signal waveform diagram for explaining an operation of the DSB mixer in FIG. 6.

As an example, as illustrated in FIG. 7, in the case of inactivation of the synthesis and amplification control signal MACON, the second input set LOI+ and LOI− is off. In this instance, the output RFOI+ having a phase and frequency identical to the RFI+, and the output RFOI− having a phase and frequency identical to the RFI, may be generated by an amplification mode operation of the amplifier 610. Also, upon activation of the synthesis and amplification control signal MACON to a level of BIAS, the second input set LOI+ and LOI− is input normally. In this instance, frequency synthesized signals RFOI+ and RFOI− may be generated by a synthesis mode operation of the amplifier 610.

However, as illustrated in FIG. 7, while the synthesis and amplification control signal MACON is converted from the inactivation to the level of BIAS, bias effects of M1 and M5 and bias effects of M2 and M4 are different. As described above, bias offset effects occurring in a gate of M2 and M4 may deteriorate system performance in a ubiquitous system needing a fast frequency switching time of less than 9.5 nsec.

Figure 8:
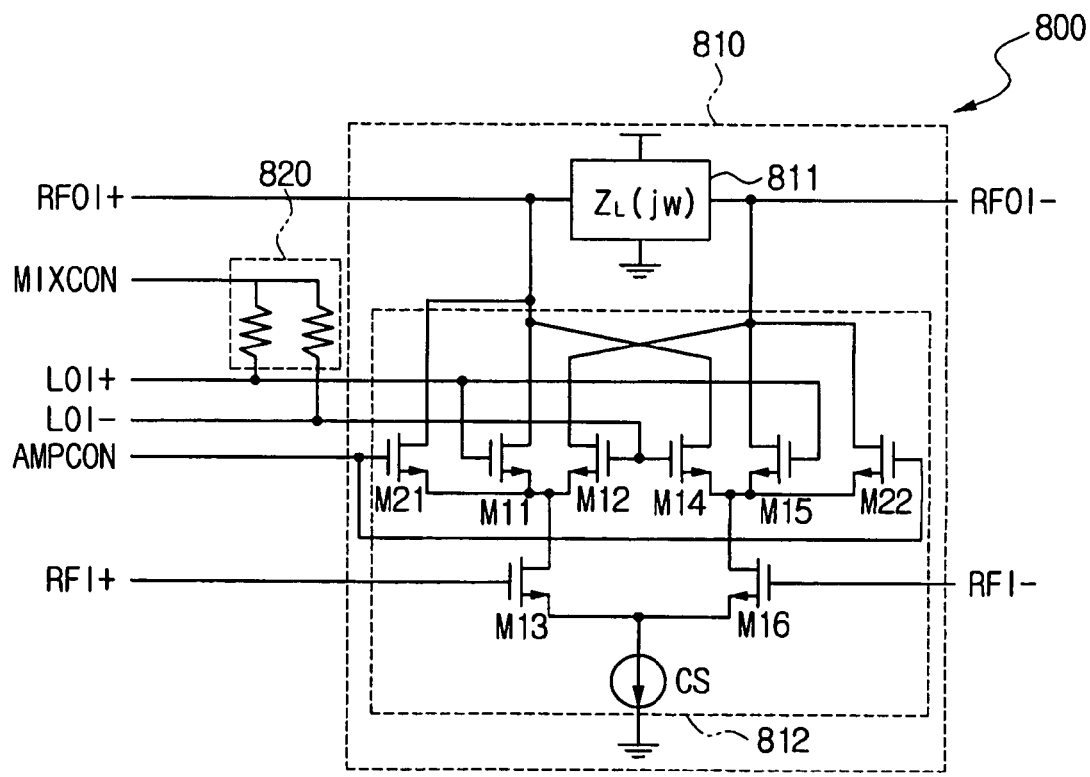
FIG. 8 is an explicit circuit diagram of a DSB mixer according to another exemplary embodiment of the present invention.

An explicit circuit diagram of a DSB mixer 800 which provides fast switching, according to another exemplary embodiment of the present invention is illustrated in FIG. 8. Referring to FIG. 8, the DSB mixer 800 includes an amplifier 810 and a mode controller 820.

The amplifier 810 is in the form of a differential amplifier, which is similar to the amplifier 610 in FIG. 6. Also, the amplifier 810 includes a load LC circuit 811 and a differential input circuit 812. In this instance, the load LC circuit 811 includes an inductor and a capacitor. Also, the differential input circuit 812 includes a current source CS. The load LC circuit 811 is designed to have a certain impedance $Z_L$. In the differential input circuit 812, N-type MOSFET M13 and N-type MOSFET M16, which receive a first input set RFI+ and RFI− comprising differential signals, are provided to be symmetrical to each other. Also, N-type MOSFET M11 and M12, and N-type MOSFET M14 and M15, which receive a second input set LOI+ and LOI−, comprising other differential signal, are provided to be symmetrical to each other. Also, an amplification control signal AMPCON is input via gates of transistors M21 and M22, which are connected in parallel with transistors M11 and M15, respectively, to receive any one of the second input set LOI+ and LOI−.

The mode controller 820 includes two resistors. The resistors are connected between each signal terminal of the second input set LOI+ and LOI− and a terminal that supplies a synthesis control signal MIXCON.

If any one of the amplification control signal AMPCON and the synthesis control signal MIXCON are activated, the amplifier 810 may selectively generate an output set, RFOI+ and RFOI−, having a phase and frequency identical to the first input set RFI+ and RFI−, or generate an output set, RFOI+ and RFOI−, having a frequency which is a synthesized frequency of the second input set LOI+ and LOI−.

Figure 9:
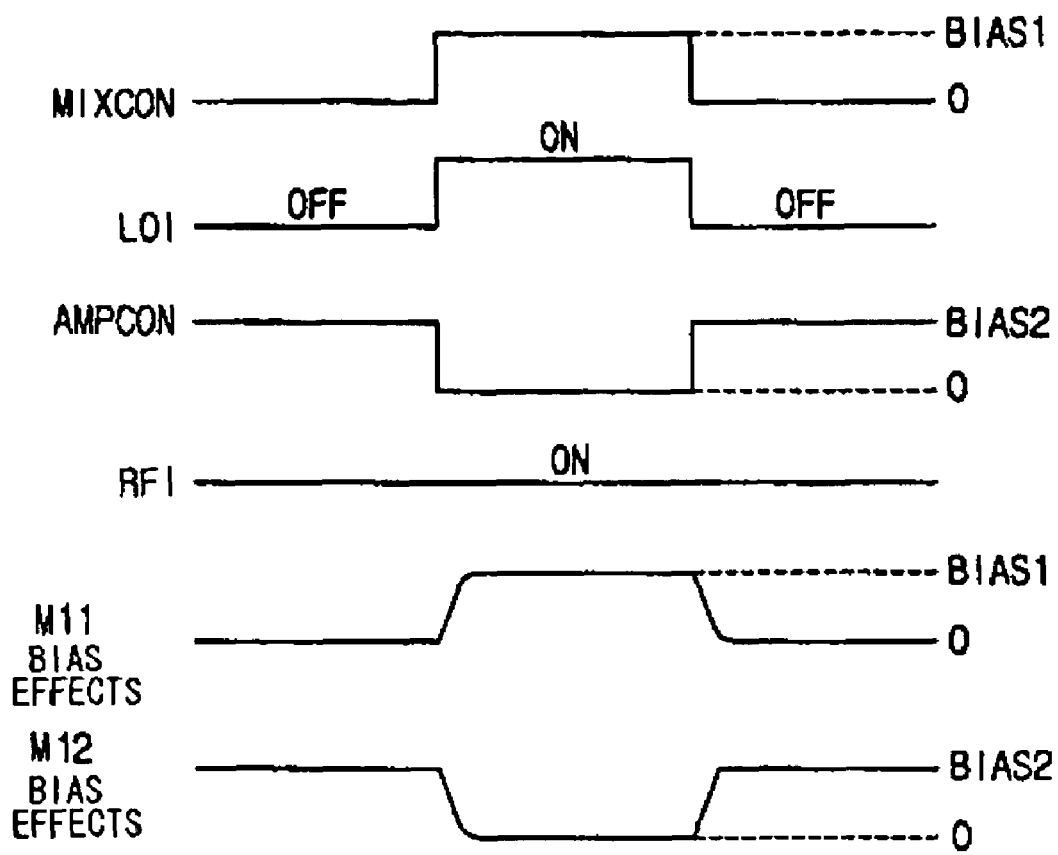
FIG. 9 is a signal waveform diagram for explaining an operation of the DSB mixer in FIG. 8.

As an example, as illustrated in FIG. 9, in the case of inactivation of the synthesis control signal MIXCON and activation of the amplification control signal AMPCON to a level of BIAS2, the second input set LOI+ and LOI− is off and the first input set RFI+ and RFI− is input normally. In this instance, the output RFOI+ having a phase and frequency identical to the RFI+, and the output RFOI− having a phase and frequency identical to the RFI− may be generated by an amplification mode operation of the amplifier 810.

Also, upon activating the synthesis control signal MIXCON to a level of BIAS1 and inactivating the amplification control signal AMPCON, the first input set RFI+ and RFI− and the second input set LOI+ and LOI− are input normally. In this case, the frequency synthesized signals RFOI+ and RFOI− may be generated by a synthesis mode operation of the amplifier 810. The bias levels BIAS1 and BIAS2 may be different, but also may be the same.

By way of example, as illustrated in FIG. 9, in the amplifier 810, when the amplification control signal AMPCON or the synthesis control signal MIXCON is converted from inactivation to a certain bias level such as BIAS 1 or BIAS2, bias effects of M11 and M15 are identical to bias effects of M12 and M14. Namely, the output signals RFOI+ and RFOI− may be normally generated in a fast switching time of less than 9.5 nsec by symmetrically actuated transistors. When symmetrical transistors such as M11 and M15, and M12 and M14 are actuated without bias offset effects, an output is normally generated by a fast switching time of the amplifier 810. Accordingly, system performance in a ubiquitous system may be improved.

Figure 10:
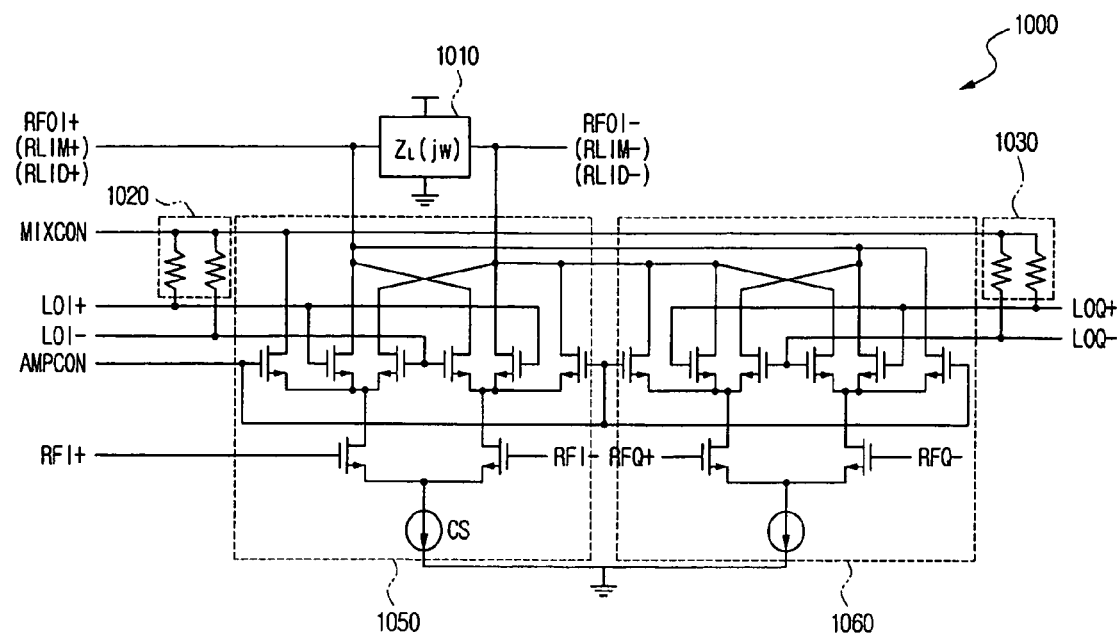
FIG. 10 is an explicit circuit diagram of an SSB mixer according to an exemplary embodiment of the present invention.

The above described DSB mixers of FIGS. 6 and 8 may be applicable to the SSB mixers 311 and 312 of FIG. 3. An explicit circuit diagram of an SSB mixer according to an exemplary embodiment of the present invention is illustrated in FIG. 10. A circuit corresponding to the I-SSB mixer 311 of FIG. 3 is illustrated in FIG. 10, and the Q-SSB mixer 312 may be similarly embodied by changing internal wiring.

An I-SSB mixer 1000 of FIG. 10 includes an LC circuit 1010 corresponding to the load LC circuit 811 of FIG. 8. The LC circuit 1010 is shared by differential input circuits 1050 and 1060. Each of the differential input circuits 1050 and 1060 corresponds to the differential input circuit 812 of FIG. 8. Also, the I-SSB mixer 1000 includes mode controllers 1020 and 1030 corresponding to the mode controller 820 of FIG. 8. An operation of an SSB mixer using two DSB mixers has been described in FIGS. 4 and 5.

According to the mode control signals MIXCON and AMPCON as in FIG. 9, the I-SSB mixer 1000 may selectively generate the output RFOI having a phase and frequency identical to the first high frequency signal RFI or generate the output RLIM or RLID having a frequency which is a synthesized frequency of the first high frequency signal RFI and the second high frequency signal LOI.

Also, a Q-SSB mixer may be embodied by changing wiring of FIG. 10. According to the mode control signals MIXCON and AMPCON, the Q-SSB mixer may selectively generate the Q signal, RFOQ, of the RFOI, or generate the Q signal, RLQM or RLQD, of the RLIM or RLID.

Figure 11:
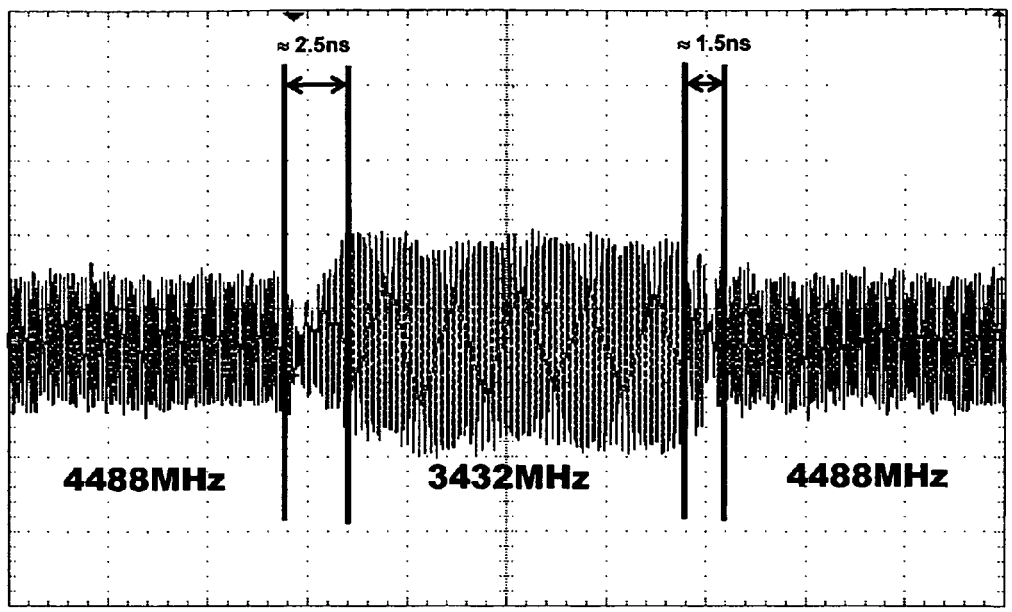
FIG. 11 is a waveform diagram illustrating a frequency change process of an output signal according to a phase control of a path switch.
Figure 12:
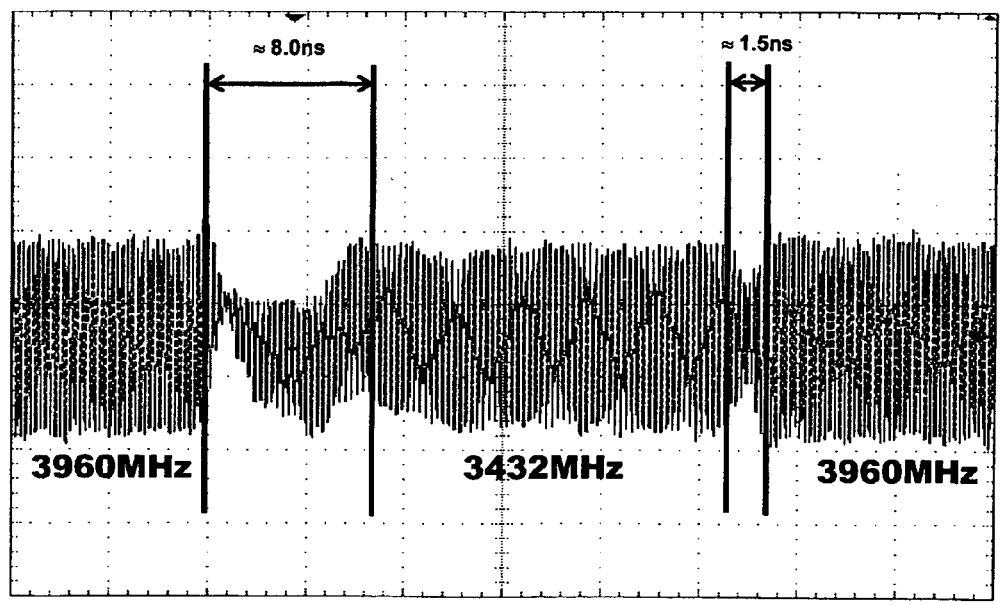
FIG. 12 is a waveform diagram illustrating a frequency change process of an output signal according to mode switching.

An exemplary frequency change process according to a phase control or mode switching when applying an SSB mixer having the structure of FIG. 10 is illustrated in FIGS. 11 and 12.

FIG. 11 illustrates a frequency change process of an output signal, e.g., RFOI, according to the phase control signal PHA of the path switch 320 in FIG. 3. As an example, when the RFI is a high frequency signal of 3960 MHz and LOI is also a high frequency signal of 528 MHz, the SSB mixers 311 and 312 may switch so that a signal having a frequency which is a sum of frequencies of the RFI and the LOI, i.e., 4488 MHz, or a signal having a frequency which is a difference of frequencies between the RFI and the LOI, i.e., 3432 MHz, is selectively output according to a logic state of the phase control signal PHA. Accordingly, fast mode switching of less than 9.5 nsec, for example, which is needed in a ubiquitous system and the like, may be possible.

FIG. 12 illustrates an exemplary frequency change process of an output signal, e.g., RFOI, according to the mode control signal MODE in FIG. 3. As an example, when the RFI is a high frequency signal of 3960 MHz and LOI is also a high frequency signal of 528 MHz, the SSB mixers 311 and 312 may switch so that a signal having a frequency which is a sum of frequencies of the RFI and the LOI, i.e., 4488 MHz, or a signal having a frequency which is a difference of frequencies between the RFI and the LOI, i.e., 3432 MHz is selectively output according to a logic state of the mode control signal MODE. Thus, fast mode switching of less than 9.5 nsec, for example, which is needed in a ubiquitous system and the like, may be possible.

As described above, in the frequency synthesizer 300 according to an exemplary embodiment of the present invention, the SSB mixer 311 or 312 selectively generates and outputs a signal, e.g., RFOI, having a frequency which is identical to the input signal RF, or generates and outputs a frequency synthesized signal of input signals RF and LO, e.g., RLIM or RLID. Frequency synthesized signals, e.g., RLIM or RLID, or RLQM or RLQD, having a frequency which is a sum of frequencies of the input signals RF and LO or a difference of frequencies therebetween, may be selectively generated by changing wiring of the path switch 320 according to the phase control signal PHA.

As described above, in a frequency synthesizer according to the exemplary embodiments of the present invention, a mixer selectively generates and outputs high multi-frequency signals by only mode switching. Accordingly, after generation of high frequency signals, the frequency synthesizer according to the exemplary embodiments of the present invention may stably operate fast with low power consumption, without a selection load. Accordingly, the frequency synthesizer according to the exemplary embodiments of the present invention may be applied to, for example, a transceiver of a ubiquitous system, a cellular phone, a DBM phone, a PDA, etc., for transceiving high speed wireless data. Also, the frequency synthesizer may improve system performance.

The exemplary embodiments of the method and apparatus disclosed in the present specification may be embodied in a recordable or readable medium, in a computer readable code. Suitable computer media includes all types of readable devices which store data read by a computer system. Examples of computer readable media include, but are not limited to, read-only memory devices (ROM), random access memory (RAM), CD-ROM, magnetic tapes, floppy disks, optical data storage devices, etc. Also, the media may include a carrier means, such as transmission via the Internet. Also, the media may be distributed to a network connected to a computer system. Computer readable code used for embodying the invention may be stored and implemented by a method of dispersion.

Although a few exemplary embodiments of the present invention have been shown and described, the present invention is not limited to the described embodiments. Instead, it would be appreciated by those skilled in the art that changes may be made to these exemplary embodiments without departing from the principles and spirit of the invention, the scope of which is defined by the claims and their equivalents.

What is claimed is:

1. A frequency synthesizer comprising:
 a first double side band mixer which receives a first input signal and a second input signal; and
 a second double side band mixer which receives a Q signal of the first input signal and a Q signal of the second input signal,
 wherein the frequency synthesizer selectively generates and outputs a signal having a frequency which is identical to a frequency of the first input signal, or generates and outputs a frequency synthesized signal of the first input signal and the second input signal, from a terminal which connects an output of the first double side band mixer and an output of the second double side band mixer, according to a mode control signal.

2. The frequency synthesizer of claim 1, wherein a frequency of the frequency synthesized signal is one of a sum of the frequency of the first input signal and a frequency of the second input signal, and a difference of the frequency of the first input signal and the frequency of the second input signal.

3. The frequency synthesizer of claim 1, wherein each of the first input signal and the second input signal is a set of differential signals.

4. The frequency synthesizer of claim 1, wherein the signal which is generated by the frequency synthesizer has a frequency which is identical to the first input signal, and a phase which is identical to one of a phase of the first input signal and the Q signal of the first input signal.

5. The frequency synthesizer of claim 1, wherein a phase of the frequency synthesized signal is identical to a phase of the first input signal.

6. The frequency synthesizer of claim 1, wherein the frequency synthesized signal has a phase difference of 90 degrees with respect to the first input signal.

7. A frequency synthesizer comprising:
a first single side band mixer which receives a first input set comprising a first input signal and a Q signal thereof, and a second input set comprising a second input signal and a Q signal thereof, and
a second single side band mixer which receives the first input set and the second input set,
wherein:
the first single side band mixer selectively generates a first output having a phase and a frequency which are identical to a phase and a frequency of the first input signal, or generates a second output having a frequency which is a synthesized frequency of the first input signal and the second input signal, according to a mode control signal, and
the second single side band mixer selectively generates the Q signal of the first output or the Q signal of the second output according to the mode control signal.

8. The frequency synthesizer of claim 7, wherein paths to supply differential signals of, at least one of, the second input signal and differential signals of the Q signal of the second input signal, to the first single side band mixer and the second single side band mixer are switched via a switch which is controlled by a phase control signal, such that the frequency synthesized signal has a frequency which is one of a sum of the frequency of the first input signal and a frequency of the second input signal, and a difference of the frequency of the first input signal and the frequency of the second input signal.

9. A double side band mixer comprising:
an amplifier which receives a first input set comprising differential signals and a second input set comprising other differential signals; and
a resistor connected between a signal terminal of any one of the second input set and a terminal supplying a synthesis and amplification control signal,
wherein the amplifier selectively generates a first signal output set which has a phase and a frequency which are identical to a phase and a frequency of the first input set, or a second signal output set which has a frequency which is a synthesized frequency of the first input set and the second input set, according to the synthesis and amplification control signal.

10. A double side band mixer comprising:
an amplifier which receives a first input set comprising differential signals and a second input set comprising other differential signals; and
resistors connected between each of signal terminals of the second input set and a terminal supplying a synthesis control signal,
wherein:
the amplifier receives an amplification control signal via a gate of a transistor connected in parallel with a transistor which receives any one of the differential signals of the second input set, and
the amplifier selectively generates at least one of a first output signal set having a phase and a frequency which are identical to a phase and a frequency of the first input set, and a second signal output set having a frequency which is a synthesized frequency of the first input set and the second input set, if any one of the amplification control signal and the synthesis control signal is activated.

11. A method for synthesizing frequencies using a first double side band mixer and a second double side band mixer, the method comprising:
receiving a first input signal and a second input signal in the first double side band mixer;
receiving a Q signal of the first input signal and a Q signal of the second input signal in the second double side band mixer;
generating a frequency synthesized signal of the first input signal and the second input signal from a terminal connecting an output of the first double side band mixer and an output of the second double side band mixer, if a mode control signal which controls the type of an output is activated; and
generating a signal having a frequency which is identical to a frequency of the first input signal, from a terminal connecting the output of the first double side band mixer and the output of the second double side band mixer, if the mode control signal is inactivated.

12. The method of claim 11, wherein a frequency of the frequency synthesized signal is one of a sum of the frequency of the first input signal and a frequency of the second input signal, and a difference of the frequency of the first input signal and the frequency of the second input signal.

13. The method of claim 11, wherein each of the first input signal and the second input signal is a set of differential signals.

14. The method of claim 11, wherein the signal which is generated to have the frequency identical to the frequency of the first input signal, has a phase identical to a phase of one of the first input signal and the Q signal of the first input signal.

15. The method of claim 11, wherein a phase of the frequency synthesized signal is identical to a phase of the first input signal.

16. The method of claim 11, wherein the frequency synthesized signal has a phase difference of 90 degrees with respect to the first input signal.

17. A method for synthesizing frequencies using a first single side band mixer and a second single side band mixer, the method comprising:
receiving a first input set comprising a first input signal and a Q signal of the first input signal, and a second input set comprising a second input signal and a Q signal of the second input signal, in the first single side band mixer and the second single side band mixer;
generating a first output which has a synthesized frequency of the first input signal and the second input signal, from the first single side band mixer, and generating a Q signal of the first output from the second single side band mixer, if a mode control signal which controls the type of an output is activated; and
generating a second output which has a phase and a frequency that are identical to the first input signal, from the first single side band mixer, and a Q signal of the second output from the second single side band mixer, if the mode control signal is inactivated.

18. The method of claim 17, wherein at least one of a path to supply differential signals of the second input signal and a path to supply differential signals of the Q signal of the second input signal, to the first single side band mixer and the second single side band mixer, is switched via a switch which is controlled by a phase control signal, such that the frequency synthesized signal has one of a frequency which is a sum of the frequency of the first input signal and the frequency of the second input signal, and a difference of the frequency of the first input signal and the frequency of the second input signal.

19. A computer readable medium having stored thereon a program for synthesizing frequencies using a first double side band mixer and a second double side band mixer, the method comprising:

receiving a first input signal and a second input signal in the first double side band mixer;

receiving a Q signal of the first input signal and a Q signal of the second input signal in the second double side band mixer;

generating a frequency synthesized signal of the first input signal and the second input signal from a terminal connecting an output of the first double side band mixer and an output of the second double side band mixer, if a mode control signal which controls a type of an output is activated; and generating a signal having a frequency which is identical to a frequency of the first input signal, from a terminal connecting the output of the first double side band mixer and the output of the second double side band mixer, if the mode control signal is inactivated.

20. A computer readable medium having stored thereon a program for synthesizing frequencies using a first single side band mixer and a second single side band mixer, the method comprising:

receiving a first input set comprising a first input signal and a Q signal of the first input signal, and a second input set comprising a second input signal and a Q signal of the second input signal, in the first single side band mixer and the second single side band mixer;

generating a first output which has a synthesized frequency of the first input signal and the second input signal, from the first single side band mixer, and generating a Q signal of the first output from the second single side band mixer, if a mode control signal which controls the type of an output is activated; and generating a second output which has a phase and a frequency that are identical to the first input signal, from the first single side band mixer, and a Q signal of the second output from the second single side band mixer, if the mode control signal is inactivated.

* * * * *